United States Patent [19]

Leung et al.

[11] Patent Number: 4,916,337
[45] Date of Patent: Apr. 10, 1990

[54] TTL TO CMOS LOGIC LEVEL TRANSLATOR

[75] Inventors: Wingyu Leung, Cupertino; Winston K. M. Lee, San Francisco, both of Calif.

[73] Assignee: Integrated Device Technology, Inc., Santa Clara, Calif.

[21] Appl. No.: 320,312

[22] Filed: Mar. 7, 1989

[51] Int. Cl.[4] .............. H03K 19/092; H03K 19/094; H03K 19/20; H03K 17/04
[52] U.S. Cl. .................................... 307/475; 307/451; 307/479; 307/585; 323/316; 330/288
[58] Field of Search ............... 307/475, 264, 270, 571, 307/594, 451, 585, 576, 579, 279; 323/312, 315, 316, 317; 330/257, 288

[56] References Cited

U.S. PATENT DOCUMENTS

| 4,380,710 | 4/1983 | Cohen et al. | 307/475 |
| 4,677,321 | 6/1987 | Bacrania | 307/475 |
| 4,682,047 | 7/1987 | Sichart | 307/585 |
| 4,686,383 | 8/1987 | Croft | 307/571 |
| 4,717,845 | 1/1988 | Dunn | 307/475 |
| 4,763,022 | 8/1988 | Sheldon | 307/475 |
| 4,845,388 | 7/1989 | Amatangelo | 307/475 |

Primary Examiner—Stanley D. Miller
Assistant Examiner—David R. Bertelson
Attorney, Agent, or Firm—Thomas E. Schatzel

[57] ABSTRACT

Four transistors, a pair of buffers, and an inverter are configured with the first transistor connected in a pull-up configuration, with the transistor drain connected to a first node and with the transistor gate connected to a second node. The second transistor is connected in a pull-down configuration, with the transistor gate connected to a (data) input line and with the transistor drain connected to the first node. The third transistor is also connected in the pull-up configuration, with the transistor gate connected to the first node and with the transistor drain connected to the second node. The fourth transistor is also connected in the pull-down configuration, with the transistor gate coupled by the inverter to the input line and with the transistor drain connected to the second node. The buffers are each connected between a respective one of the nodes and a respective one of two (data) output lines.

5 Claims, 1 Drawing Sheet

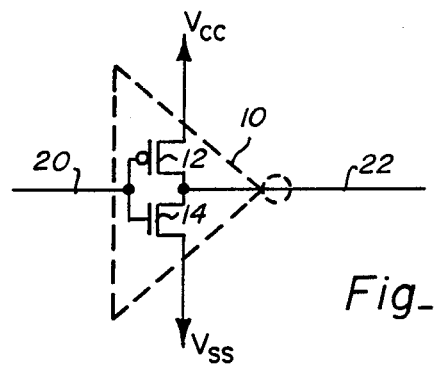
Fig_1 (PRIOR ART)
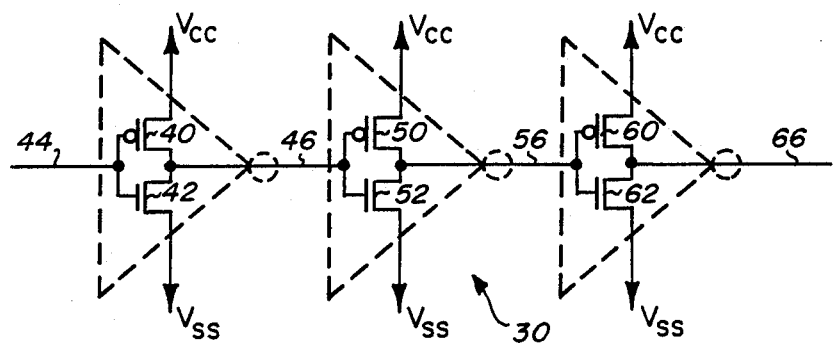
Fig_2 (PRIOR ART)
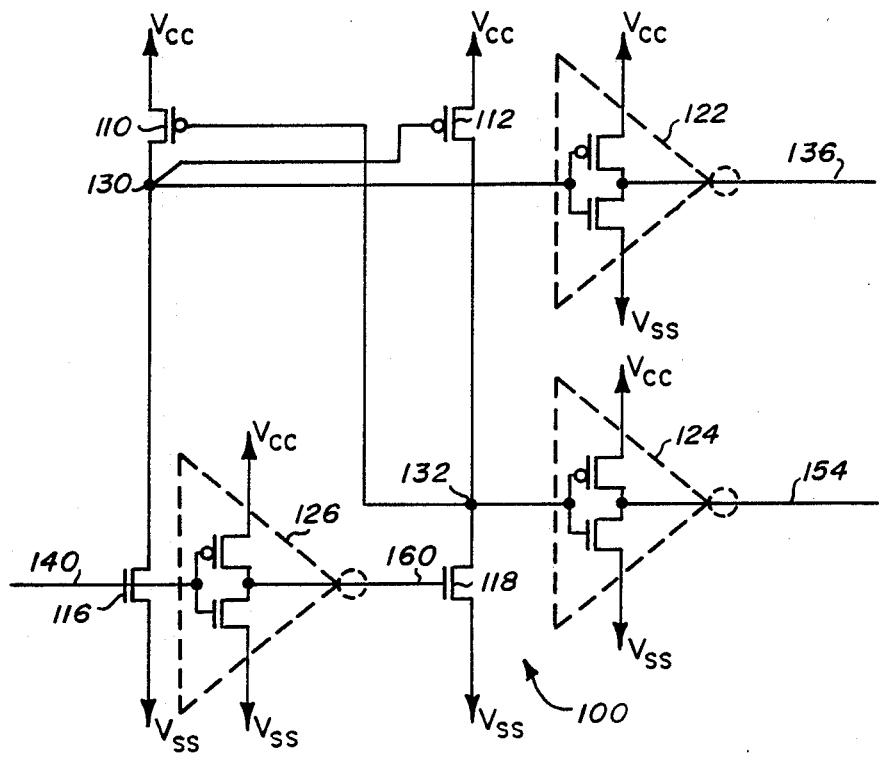
Fig_3

TTL TO CMOS LOGIC LEVEL TRANSLATOR

TECHNICAL FIELD

The present invention relates to integrated circuit devices generally and more particularly to a TTL to CMOS logic level translator.

BACKGROUND ART

Heretofore, it has been necessary to trade DC power consumption for speed and/or drive capability in TTL to CMOS logic level translator design. For example, consider the prior-art-type CMOS inverter illustrated in FIG. 1 of the drawing generally designated by the numbers 10. Inverter 10 is shown to include a P-channel, field-effect transistor (FET), which is designated 12, and an N-channel, field-effect transistor, designated 14. Transistors 12 and 14 are connected in what is referred to herein as a (P-channel over N-channel) totem-pole configuration. More specifically, transistor 12 is configured in a CMOS, pull-up configuration, with the transistor gate connected to a (data) input line 20, with the (end of the channel referred to herein as the) transistor source connected to receive a DC power supply potential (Vcc), and with the (other end of the channel, referred to herein as the) transistor drain connected to a (data) output line 22, upon which inverter 10 develops a data output signal. Transistor 14 is configured in a CMOS, pull-down configuration, with the transistor gate connected to line 20, with the transistor drain connected to line 22, and with the transistor source connected to receive a circuit ground potential (Vss).

Operationally, when a low logic signal level potential is externally developed on line 20, transistor 12 is turned on; and, transistor 14 is turned off. With transistor 12 on and transistor 14 off, transistor 12 sources a current flow from the power supply potential (Vcc) into line 22, developing a high, CMOS, logic signal level potential on the line. When a high, CMOS, logic signal level potential is externally developed on line 20, transistor 12 is turned off; and, transistor 14 is turned on. With transistor 12 off and transistor 14 on, transistor 14 sinks a current flow from line 22 to circuit ground (Vss), developing a low, CMOS, logic signal level potential on the line. When a high, TTL, logic signal level potential (a potential of at least 2.4 volts) is externally developed on line 20, transistor 14 is turned on. However, the high, TTL, logic signal level potential may not be high enough to turn transistor 12 off. As a consequence, a (DC power consuming) steady-state (quiescent) current may flow from the power supply potential (Vcc) through transistors 12 and 14 to circuit ground (Vss). The level of the quiescent current flow is dependent upon the width of the channels of transistors 12 and 14. If transistors 12 and 14 have relative narrow channels, the quiescent current level will be relatively low. However, with relatively narrow channels, the transistors will have a relatively low drive capability.

To both reduce the level of the quiescent current flow and maintain relatively high drive capability, the prior-art-type TTL to CMOS logic level translator illustrated in FIG. 2 of the drawing, generally designated by the numbers 30, may be used. Translator 30 is shown to employ three inverters connected in cascade. More specifically, translator 30 includes a pair of transistors 40 and 42 connected (in the P-channel over N-channel totem-pole configuration) as an inverter between a (data input) line 44 and a line 46; another pair of transistors 50 and 52 connected (in the P-channel over N-channel totem-pole configuration) as an inverter between line 46 and a line 56; and, yet another pair of transistors 60 and 62 connected (in the P-channel over N-channel totem-pole configuration) as an inverter between line 56 and a (data output) line 66. To minimize the level of the (DC power consuming) quiescent current flow, transistors 40 and 42 have relatively narrow channels. To maximize drive capability, transistors 60 and 62 have relatively wide channels. Unfortunately, however, because of the three inverters, each contributing one gate delay, translator 30 is relatively slow.

DISCLOSURE OF THE INVENTION

It is therefore the primary object of the present invention to provide a TTL to CMOS logic level translator having a relatively low DC power consumption level.

Another object of the present invention is to provide a TTL to CMOS logic level translator having relatively high drive capability.

Another object of the present invention is to provide a TTL to CMOS logic level translator which is relatively fast.

Another object of the present invention is to provide a TTL to CMOS logic level translator having a pair of complementary outputs.

Yet another object of the present invention is to provide a TTL to CMOS logic level translator which is relatively simple and suitable for integration into an integrated circuit type device.

Briefly, the presently preferred embodiment of a TTL to CMOS logic level translator in accordance with the present invention includes four transistors, a pair of buffers, and an inverter. The first transistor is connected in a pull-up configuration, with the transistor drain connected to a first node and with the transistor gate connected to a second node. The second transistor is connected in a pull-down configuration, with the transistor gate connected to a (data) input line and with the transistor drain connected to the first node. The third transistor is also connected in the pull-up configuration, with the transistor gate connected to the first node and with the transistor drain connected to the second node. The fourth transistor is also connected in the pull-down configuration, with the transistor gate coupled by the inverter to the input line, and with the transistor drain connected to the second node. The buffers are each connected between a respective one of the nodes and a respective one of two (data) output lines.

These and other objects of the present invention will no doubt become apparent to those skilled in the art after having read the detailed description of the presently preferred embodiment of the present invention which is illustrated in the figures of the drawing.

BRIEF DESCRIPTION OF THE FIGURES IN THE DRAWING

FIG. 1 is a schematic diagram of a prior-art-type inverter;

FIG. 2 is a schematic diagram of a prior-art-type TTL to CMOS logic level translator; and FIG. 3 is a schematic diagram of a TTL to CMOS logic level translator in accordance with the presently preferred embodiment of the present invention.

BEST MODE FOR CARRYING OUT THE INVENTION

Illustrated in FIG. 3 of the drawing generally designated by the number 100 is the presently preferred embodiment of a TTL to CMOS logic level translator in accordance with the present invention. Translator 100 is shown to include a pair of P-channel, field-effect transistors, respectively designated 110 and 112, a pair of N-channel, field-effect transistors, respectively designated 116 and 118, a pair of buffers (inverters), respectively designated 122 and 124, and an inverter, designated 126. Transistor 110 is connected in a pull-up configuration, with the (end of the channel referred to herein as the) transistor source connected to receive a DC power supply potential (Vcc), with the (other end of the channel, referred to herein as the) transistor drain connected to a node 130, and with the transistor gate connected to a node 132. Node 130 is connected to the input of buffer 122, the output of which is connected to a (true) (data) output line 136. Transistor 116 is connected in a pull-down configuration, with the transistor gate connected to a (data) input line 140, with the transistor drain connected to node 130, and with the transistor source connected to receive a circuit ground potential (Vss). Transistor 112 is also connected in the pull-up configuration, and with the transistor gate connected to node 130, with the transistor source connected to receive a DC power supply potential (Vcc), and with the transistor drain connected to node 132. Node 132 is connected to the input of buffer 124, the output of which is connected to an (inverted) (data) output line 154. Transistor 118 is also connected in the pull-down configuration, with the transistor gate connected by a line 160 to the output of inverter 126, the input of which is connected to line 140, with the transistor drain connected to node 132, and with the transistor source connected to receive a circuit ground potential (Vss).

In the presently preferred embodiment, the field-effect transistors have the following parameters:

| Transistor | Type | Threshold Voltage | Channel Width | Channel Length |
|---|---|---|---|---|
| 110 | P-Channel | −0.7 Volts | 8 Microns | 0.9 Microns, |
| 112 | P-Channel | −0.7 Volts | 8 Microns | 0.9 Microns, |
| 116 | N-Channel | 0.7 Volts | 20 Microns | 0.8 Microns, |
| 118 | N-Channel | 0.7 Volts | 20 Microns | 0.8 Microns, |
| 122 | P-Channel | −0.7 Volts | 22 Microns | 0.9 Microns, |
| 122 | N-Channel | 0.7 Volts | 30 Microns | 0.8 Microns, |
| 124 | P-Channel | −0.7 Volts | 30 Microns | 0.9 Microns, |
| 124 | N-Channel | 0.7 Volts | 22 Microns | 0.8 Microns, |
| 126 | P-Channel | −0.7 Volts | 4.5 Microns | 0.9 Microns, and |
| 126 | N-Channel | 0.7 Volts | 12 Microns | 0.8 Microns. |

Operationally, responsive to the TTL logic level of a signal externally developed on line 140, inverter 126 develops a signal of inverted level on line 160. When the state of the signal externally developed on line 140 changes from a low, TTL, logic potential level (of at most 0.8 volts) to a high, TTL, logic potential level (of at least 2.4 volts), transistor 116 is turned on; and, transistor 118 is turned off. When transistor 116 is on, the transistor pulls down (to circuit ground level) the level of the potential developed at node 130, turning on transistor 112. When turned on, transistor 112 pulls up (to the power supply potential level Vcc) the level of the potential developed at node 132, turning off transistor 110. Conversely, when the state of the signal externally developed on line 140 changes from a high, TTL, logic potential level to a low, TTL, logic potential level, transistor 116 is turned off; and, transistor 118 is turned on. When transistor 118 is on, the transistor pulls down (to circuit ground level) the level of the potential developed at node 132, turning on transistor 110. When turned on, transistor 110 pulls up (to the power supply potential level Vcc) the level of the potential developed at node 130, turning off transistor 112. It should be noted that the switching occurs in a high gain, regenerative manner. Further, it should be noted that the switching provides a noise rejecting hysteresis characteristic. Finally, it should be noted that significant (DC power consuming) steady-state (quiescent) current flow occurs only in inverter 126.

In the presently preferred embodiment, sixteen, similar, TTL to CMOS logic level translators, in accordance with the present invention, are all integrated into a single device with a 64K bit CMOS, static, random access memory (RAM) array. The other translators are represented in the drawing by a translator 100'. (For clarity, the RAM array is not shown.) The sixteen TTL to CMOS logic level translators are each connected between a respective one of sixteen address input lines and a respective one of sixteen RAM array address inputs to translate from TTL logic potential level to CMOS logic potential level the level of externally developed RAM array addressing signals.

It is contemplated that after having read the preceding disclosure, certain alterations and modifications of the present invention will no doubt become apparent to those skilled in the art. It is therefor intended that the following claims be interpreted to cover all such alterations and modifications as fall within the true spirit and scope of the invention.

What is claimed is:

1. A TTL to CMOS logic level translator comprising in combination:

an input line;

a pair of nodes including a first node and a second node;

an output line coupled to a predetermined one of said pair of nodes;

inverter means having an input connected to said input line and an output;

a first transistor having source means connected to receive a first power supply potential, drain means connected to said first node, and a gate connected to said second node;

a second transistor having a gate connected to said input line, drain means connected to said first node, and source means connected to receive a second power supply potential;

a third transistor having source means connected to receive said first power supply potential, drain means connected to said second node, and a gate connected to said first node;

a fourth transistor having a gate connected to said inverter output, drain means connected to said second node, and source means connected to receive said second power supply potential.

2. A TTL to CMOS logic level translator comprising in combination:

an input line;

a pair of nodes including a first node and a second node;

an output line;

a buffer having an input connected to a predetermined one of said pair of nodes and an output connected to said output line;
inverter means having an input connected to said input line and an output;
a first transistor having source means connected to receive a first power supply potential, drain means connected to said first node, and a gate connected to said second node;
a second transistor having a gate connected to said input line, drain means connected to said first node, and source means connected to receive a second power supply potential;
a third transistor having source means connected to receive said first power supply potential, drain means connected to said second node, and a gate connected to said first node;
a fourth transistor having a gate connected to said inverter output, drain means connected to said second node, and source means connected to receive said second power supply potential.

3. A TTL to CMOS logic level translator comprising in combination:
an input line;
a first node;
a second node;
inverter means having an input connected to said input line and an output;
a first transistor having source means connected to receive a first power supply potential, drain means connected to said first node, and a gate connected to said second node;
a second transistor having a gate connected to said input line, drain means connected to said first node, and source means connected to receive a second power supply potential;
a third transistor having source means connected to receive said first power supply potential, drain means connected to said second node, and a gate connected to said first node;
a fourth transistor having a gate connected to said inverter output, drain means connected to said second node, and source means connected to receive said second power supply potential.

4. A TTL to CMOS logic level translator as recited in claim 3 further comprising a first output line and first buffer means coupling said first node to said first output line.

5. A TTL to CMOS logic level translator as recited in claim 4 further comprising a second output line and second buffer means coupling said second node to said second output line.

* * * * *

REEXAMINATION CERTIFICATE (1915th)
United States Patent [19]
Leung et al.

[11] B1 4,916,337
[45] Certificate Issued Jan. 26, 1993

[54] TTL TO CMOS LOGIC LEVEL TRANSLATOR

[75] Inventors: Wingyu Leung, Cupertino; Winston K. M. Lee, San Francisco, both of Calif.

[73] Assignee: Integrated Device Technology, Inc., Santa Clara, Calif.

Reexamination Request:
No. 90/002,557, Feb. 19, 1991

Reexamination Certificate for:
Patent No.: 4,916,337
Issued: Apr. 10, 1990
Appl. No.: 320,312
Filed: Mar. 7, 1989

[51] Int. Cl.⁵ ............... H03K 19/092; H03K 19/094; H03K 19/20; H03K 17/04
[52] U.S. Cl. .................. 307/475; 307/451; 307/479; 307/585; 323/316; 330/288
[58] Field of Search ................. 307/475, 451

[56] References Cited
U.S. PATENT DOCUMENTS

| | | | |
|---|---|---|---|
| 4,314,166 | 2/1982 | Bismarck | 307/475 |
| 4,318,015 | 3/1982 | Schade, Jr. | 307/475 |
| 4,380,710 | 4/1983 | Coehen et al. | 307/475 |
| 4,677,321 | 6/1987 | Bacrania | 307/475 |
| 4,682,047 | 7/1987 | Sichart | 307/585 |
| 4,686,383 | 8/1987 | Croft | 307/571 |
| 4,717,845 | 1/1988 | Dunn | 307/475 |
| 4,763,022 | 8/1988 | Sheldon | 307/475 |
| 4,845,388 | 7/1989 | Amatangelo | 307/475 |

*Primary Examiner*—D. R. Hudspeth

[57] ABSTRACT

Four transistors, a pair of buffers, and an inverter are configured with the first transistor connected in a pull-up configuration, with the transistor drain connected to a first node and with the transistor gate connected to a second node. The second transistor is connected in a pull-down configuration, with the transistor gate connected to a (data) input line and with the transistor drain connected to the first node. The third transistor is also connected in the pull-up configuration, with the transistor gate connected to the first node and with the transistor drain connected to the second node. The fourth transistor is also connected in the pull-down configuration, with the transistor gate coupled by the inverter to the input line and with the transistor drain connected to the second node. The buffers are each connected between a respective one of the nodes and a respective one of two (data) output lines.

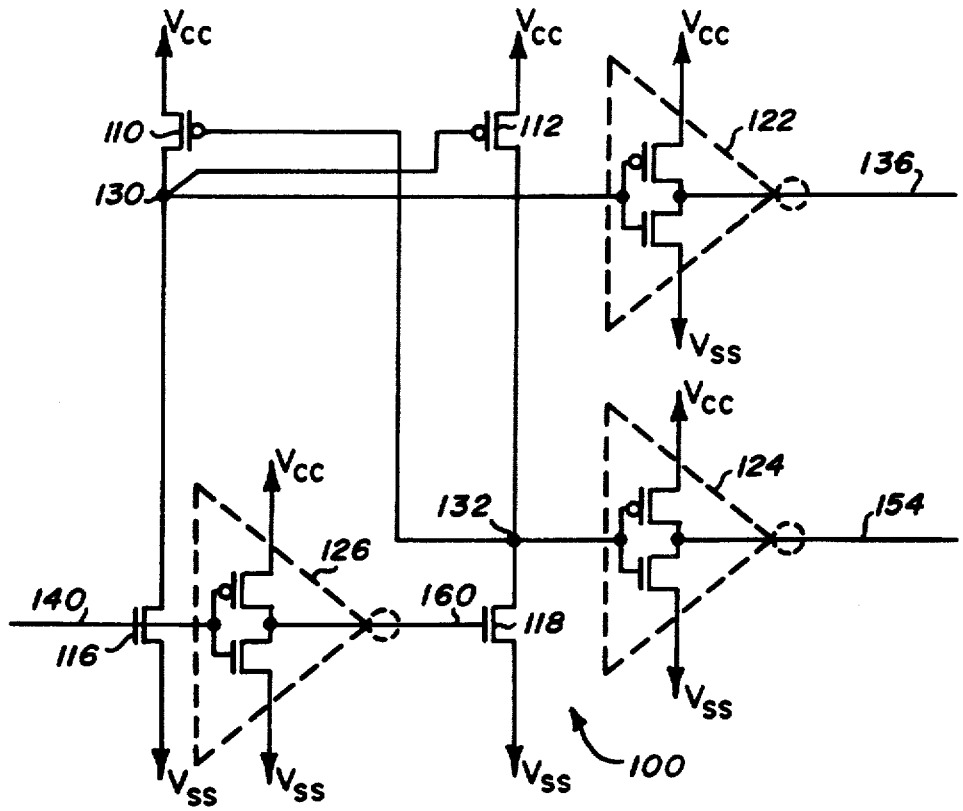

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-5 are cancelled.

* * * * *